US007126807B2

(12) United States Patent
Mizuno et al.

(10) Patent No.: US 7,126,807 B2
(45) Date of Patent: Oct. 24, 2006

(54) IONIZED AIR FLOW DISCHARGE TYPE NON-DUSTING IONIZER

(75) Inventors: Akira Mizuno, Toyohashi (JP); Akio Sugita, Tokyo (JP); Masanori Suzuki, Tokyo (JP); Tomokatsu Sato, Tokyo (JP); Toshihiko Hino, Hamamatsu (JP); Haruyuki Togari, Osaka (JP)

(73) Assignees: Techno Ryowa Ltd., Tokyo (JP); Hamamatsu Photonics K.K., Shizuoka (JP); Harada Corporation, Osaka (JP)

( * ) Notice: Subject to any disclaimer, the term of this patent is extended or adjusted under 35 U.S.C. 154(b) by 0 days.

(21) Appl. No.: 10/479,353

(22) PCT Filed: May 28, 2002

(86) PCT No.: PCT/JP02/05136

§ 371 (c)(1), (2), (4) Date: Jun. 1, 2004

(87) PCT Pub. No.: WO02/098188

PCT Pub. Date: Dec. 5, 2002

(65) Prior Publication Data

US 2004/0218315 A1 Nov. 4, 2004

(30) Foreign Application Priority Data

May 29, 2001 (JP) ............................ 2001-161060

(51) Int. Cl.
*H05F 3/06* (2006.01)
*H01T 23/00* (2006.01)
*H05K 9/00* (2006.01)

(52) U.S. Cl. ....................... 361/213; 361/230; 361/816

(58) Field of Classification Search ................ 361/230, 361/213, 816, 817
See application file for complete search history.

(56) References Cited

U.S. PATENT DOCUMENTS

| | | | | |
|---|---|---|---|---|
| 3,745,413 | A * | 7/1973 | Whitmore | 361/229 |
| 4,163,650 | A * | 8/1979 | Watson et al. | 96/57 |
| 4,166,664 | A * | 9/1979 | Herrmann, Jr. | 439/258 |
| 4,722,340 | A * | 2/1988 | Takayama et al. | 601/4 |
| 4,825,090 | A * | 4/1989 | Grabis | 250/515.1 |
| 5,349,320 | A * | 9/1994 | Suzuki et al. | 336/92 |
| 6,365,016 | B1 * | 4/2002 | Iacovangelo et al. | 204/192.38 |
| 6,522,039 | B1 * | 2/2003 | Baltz et al. | 310/88 |
| 6,671,186 | B1 * | 12/2003 | Kopf | 361/818 |

FOREIGN PATENT DOCUMENTS

| | | |
|---|---|---|
| GB | 1 380 827 | 3/1972 |
| JP | 62-171167 | 10/1987 |

(Continued)

*Primary Examiner*—Brian Sircus
*Assistant Examiner*—F Rits

(57) ABSTRACT

The ionizer of the present invention comprises a chamber which has an ionization part that ionizes a portion of an ion carrier gas that is supplied to the interior of this chamber, and a blowing part which feeds the ion carrier gas toward a charged body. The ionization part is constructed from an ionization source which is contained in the chamber, and a control device which is connected with this ionization source via a high-voltage cable. Either the generating part of a soft X-ray generating device, the generating part of a low-energy electron beam generating device or the generating part of an ultraviolet radiation generating device is used as the ionization source. The control device, the connecting part between the control device and the high-voltage cable and the connecting part between the ionization source and the high-voltage cable are formed with an explosion-proof structure.

30 Claims, 10 Drawing Sheets

FOREIGN PATENT DOCUMENTS

| | | |
|---|---|---|
| JP | 4-21832 | 4/1992 |
| JP | 6-262099 | 9/1994 |
| JP | 7-34334 | 4/1995 |
| JP | 7-63649 | 7/1995 |
| JP | 7-211483 | 8/1995 |
| JP | 8-45695 | 2/1996 |
| JP | 8-162284 | 6/1996 |
| JP | 8-190993 | 7/1996 |
| JP | 2542744 | 7/1996 |
| JP | 2668512 | 7/1997 |
| JP | 2677945 | 7/1997 |
| JP | 9-306572 | 11/1997 |
| JP | 10-106789 | 4/1998 |
| JP | 10-118573 | 5/1998 |
| JP | 10-302541 | 11/1998 |
| JP | 2001-176691 | 6/2001 |
| JP | 2001-203134 | 7/2001 |
| JP | 2001-257096 | 9/2001 |

* cited by examiner

IONIZED AIR FLOW DISCHARGE TYPE NON-DUSTING IONIZER

TECHNICAL FIELD

The present invention relates to an ionizer which is used to eliminate static electricity, and more particularly relates to an ionized gas current emission type dust-free ionizer which is an ionizer of a type that emits an ionized gas current toward the object of static electricity removal, and which can be used in explosion-proof facilities and equipment.

BACKGROUND ART

In recent years, in explosion-proof facilities such as facilities where hazardous substances are handled or the like, clogging during the air feeding of combustible powders and clogging of sieves, as well as static charge build-up and discharge in the interiors of agitating tanks for organic solvents or the like whose inside surfaces are coated with Teflon, have become problems. Conventionally, in the case of static charge build-up and discharge inside such agitating tanks, the ignition of the organic solvents has been prevented by purging the air from the tanks with $N_2$ gas, so that oxygen that might lead to ignition is eliminated. In the case of such de-charging methods, however, the initial costs and running costs of auxiliary facilities such as gas supply and exhaust facilities or the like are high, so that such methods are not desirable.

Meanwhile, air ionizing devices which neutralize electrical charges in charged bodies by means of ions have conventionally been used as devices for eliminating static electricity in production environments such as clean rooms or the like in which semiconductors, liquid crystal displays (hereafter referred to as "LCDs") or the like are manufactured. Corona discharge type ionizers are commonly used as such air ionizing devices. In the case of such corona discharge type ionizers, a high positive or negative voltage is respectively applied to a positive or negative electrode, so that a corona discharge is generated, and the air surrounding the tip end of the abovementioned electrode is positively and negatively ionized; then, these ions are conveyed by air currents so that the charges on charged bodies are neutralized by ions of the opposite polarity.

However, semiconductor and liquid crystal manufacturing devices have become progressively smaller over the years, and in the case of conventional ionizers, it has become difficult to ensure an optimal installation space. Furthermore, the demand for static electricity countermeasures in narrow spaces such as the gaps between glass substrates inside cassettes and the like has also increased.

[Problems to Be Solved]

Accordingly, when the present inventors investigated the abovementioned reduction in size of air ionizing devices, and the application of such devices to explosion-proof facilities and equipment, the inventors found that the following problem points exist. Specifically, in the case of corona discharge type ionizers commonly used in the past, there is a considerable danger that the corona discharge itself will become an ignition source; accordingly, it has not been possible to use such ionizers in explosion-proof facilities such as facilities where hazardous substances are handled or the like.

Furthermore, in order to facilitate the generation of ions and prevent the consumption of generated ions, corona discharge type ionizers ionize the air in a state in which the electrodes are exposed in the vicinity of the object of de-charging. As a result, the following problems have also occurred.

(1) Generation of Ozone

Since the air in the vicinity of the object of de-charging is ionized by a corona discharge, a reaction which converts oxygen into ozone occurs besides the ionization of nitrogen and water vapor in the air. The surfaces of silicon wafers are oxidized by the oxidizing action of this ozone, and there are reactions with minute amounts of impurities in the air so that secondary particles are generated.

(2) Generation of Electromagnetic Noise

Irregular electromagnetic noise generated from the discharge electrode during the discharge may cause malfunctioning of precision instruments, computers or the like containing semiconductor elements.

(3) Generation of Dust from the Ion Generating Electrodes

The electrodes are consumed each time that a corona discharge is caused to occur, and the consumed electrode material is scattered. Furthermore, minute amounts of gas components in the air are converted into particles by the corona discharge, and are deposited on the ion generating electrodes, and when these particles reach a certain size, the particles are again scattered. As a result of such generation of dust, the yield drops.

In recent years, furthermore, ionizers which use soft X-rays as an ionization source have been developed. However, since the connecting parts between [such] ionizers and electrical cables, and the control devices for the ionization sources do not have explosion-proof specifications, it has been impossible to use such ionizers in explosion-proof facilities such as facilities handling hazardous substances or the like.

OBJECT OF THE INVENTION

The present invention has been proposed in order to solve such problem points encountered in the prior art; it is an object of the present invention to provide an ionized gas current emission type dust-free ionizer which makes it possible to take countermeasures against static electricity in narrow spaces without causing the generation of ozone, electromagnetic noise, dust or the like, and which is also devised so that this ionizer can be used in explosion-proof facilities and equipment.

The present invention is an ionized gas current emission type dust-free ionizer which comprises a chamber having an ionization part that ionizes a portion of an ion carrier gas that is supplied to the interior of this chamber, and a blowing part that feeds the ion carrier gas toward a charged body, and in which the above-mentioned ionization part is constructed from an ionization source that is contained in the above-mentioned chamber, and a control device which is disposed outside the above-mentioned chamber and which controls the quantity of ions generated by the above-mentioned ionization source via a high-voltage cable, this ionizer being characterized in that the above-mentioned ionization source is either the generating part of a soft X-ray generating device, the generating part of a low-energy electron beam generating device, or the generating part of an ultraviolet radiation generating device, the above-mentioned chamber is formed in a cylindrical shape and is adapted so that the above-mentioned ion carrier gas is supplied to the vicinity of the ionization source inside the above-mentioned chamber from the side end portion of the chamber, and a shielding part which is used to block the soft X-rays or low-energy electron beam generated by the above-mentioned ionization source is formed between the above-mentioned ionization source and blowing part.

In the ionized gas current emission type dust-free ionizer of the present invention, which has the construction described above, since a corona discharge that might be a cause of ignition is not used as the ionization source, the ignition of combustible substances such as organic solvents or the like can be prevented. Furthermore, since the ionization source and control device are disposed so that these parts are separated from each other, and since the chamber is formed in a cylindrical shape and is adapted so that the ion carrier gas is supplied to the vicinity of the ionization source inside the chamber from the side end portion of the chamber, the internal diameter of the chamber can be reduced, so that de-charging in a narrow space can be accomplished. Furthermore, since a shielding part which is used to block the soft X-rays or low-energy electron beam generated by the ionization source is formed between the ionization source and the blowing part, it is possible to supply only ions to the charged body.

BEST MODE FOR CARRYING OUT THE INVENTION

Concrete embodiments of the present invention will be described below with reference to the attached figures.

(1) FIRST EMBODIMENT

(1-1) Construction

(1-1-1) Overall Construction

Figure 1:
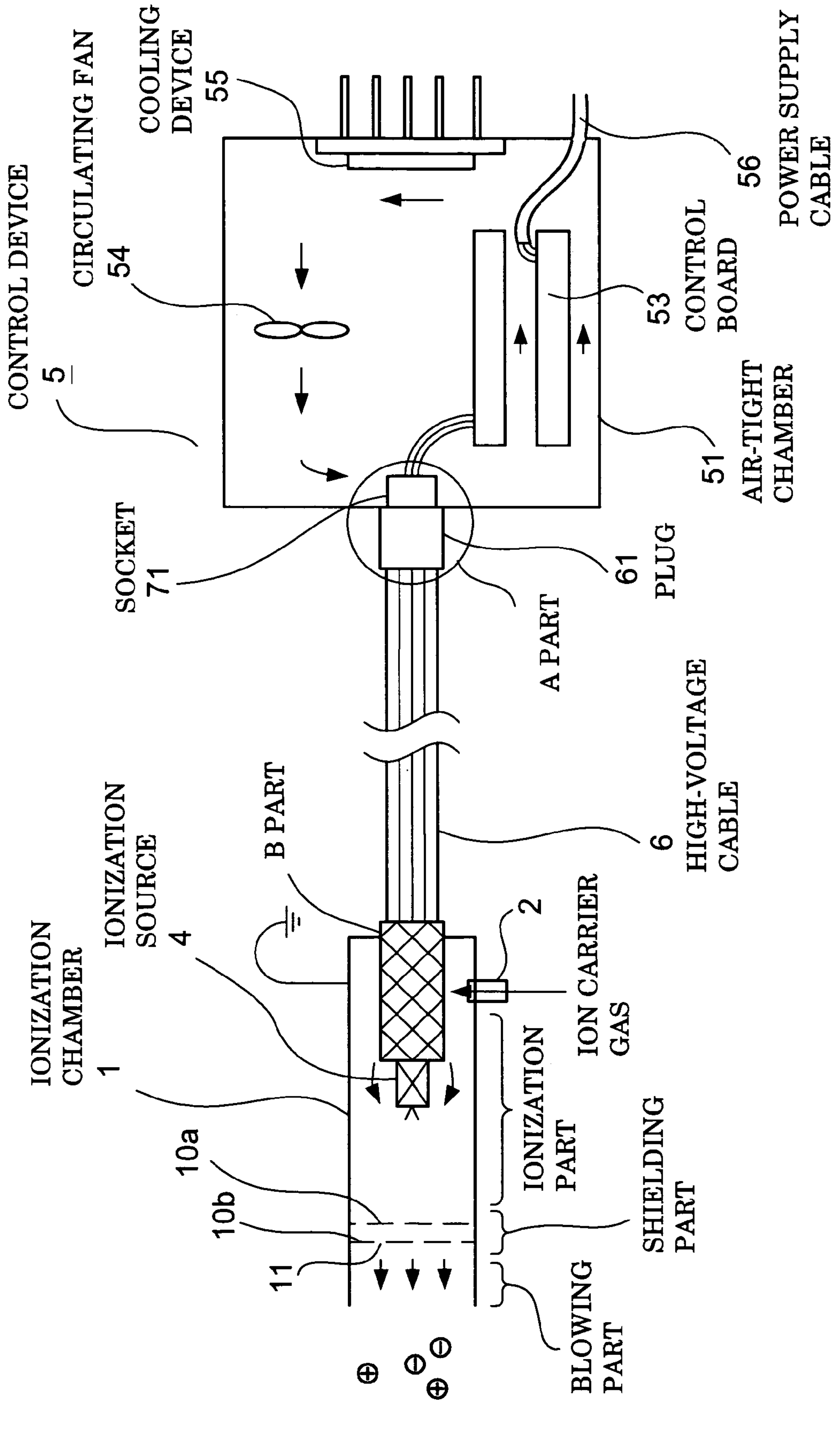
FIG. 1 is a model diagram which shows the construction of a first embodiment of the ionized gas current emission type dust-free ionizer of the present invention.

FIG. 1 is a model diagram which shows the overall construction of the ionized gas current emission type dust-free ionizer of the present embodiment. In the same figure, 1 indicates a cylindrical ionization chamber (hereafter referred to as a "chamber"); this chamber is constructed from a metal such as aluminum, stainless steel or the like, or a resin such as polyvinyl chloride or the like. Furthermore, in terms of main parts, this chamber 1 is constructed from an ionization part, a shielding part and a blowing part. An ionization source 4 is disposed in the interior of the chamber 1; this ionization source 4 is connected via a high-voltage cable 6 to a control device 5 which controls the quantity of ions generated by the ionization source 4.

Furthermore, the ionized gas current emission type dust-free ionizer of the present invention has characterizing features in the construction of the control device 5, the construction of the connecting part (part A in FIG. 1) between the control device 5 and high-voltage cable 6, and connecting part (part B in FIG. 1) between the abovementioned ionization source 4 and high-voltage cable 6. The constructions of these respective parts will be described in detail below.

(1-1-2) Construction of Control Device

As is shown in FIG. 1, the control device 5 is constructed from an air-tight chamber 51 which has an explosion-proof function. Furthermore, a control board 53 which is a control part that is used to cause the generation of soft X-rays, a low-energy electron beam or ultraviolet radiation from the abovementioned ionization source 4, a circulating fan 54 which circulates cooled air or the like, and a cooling device 55 which controls the interior of the device to a constant temperature, are installed inside the control device 5. Furthermore, a power supply cable 56 is connected to the abovementioned control board 53, and the control device 5 is thus adapted so that this device can be connected to an explosion-proof socket (not shown in the figures) installed on the outside. In the present embodiment, furthermore, the abovementioned cooling device 55 is constructed (for example) by attaching a Peltier element (thermoelectric refrigerating element) to an aluminum heat dissipating plate.

(1-1-3) Construction of Connecting Part Between High-Voltage Cable and Control Device FIG. 2(A) is an enlarged sectional view which shows the construction of the connecting part (part A in FIG. 1) between the abovementioned control device 5 and the high-voltage cable 6. Furthermore, as is described below, this connecting part has explosion-proof specifications.

Specifically, a plug 61 is attached to the tip end portion of the high-voltage cable 6; thus, the high-voltage cable 6 is adapted so that this cable can be detachably connected to a socket 71 disposed in the side wall of the control device 5. Furthermore, the abovementioned plug 61 has a three-core structure, and electrodes 63 are attached to the tip ends of electrode supporting parts 62 that have a specified length "L". Furthermore, a cap nut 65 which has a screw part 64 formed on the inside wall is attached to the outside of the base part 61*a* of the abovementioned plug 61 so that this nut can rotate.

Meanwhile, insertion holes 72 which engage with the electrode supporting parts 62 that are formed on the abovementioned plug 61 are formed in the socket 71 that is disposed in the side wall of the control device 5, and electrodes 73 that are connected with the electrodes 63 on the side of the abovementioned plug are formed in the deepest parts of these insertion holes 72. Furthermore, a screw part 74 is formed on the outer circumferential surface of the flange part 71*a* of the socket 71, and the device is adapted so that [this screw part 74] engages with the screw part 64 of the cap nut 65 attached to the abovementioned plug 61.

Furthermore, the length of the insertion holes 72 is set as "L" in correspondence to the electrode supporting parts 62 on the plug side, and this length "L" is set so that the attachment and detachment of both sets of electrodes can be performed in air-tight spaces constructed by the electrode supporting parts 62 of the plug 61 and the insertion holes 72 of the socket 71. Furthermore, as is shown in FIG. 2 (B), packing 66 such as O-rings or the like may be disposed on the base end portions of the electrode supporting parts 62 in order to maintain the air-tightness of the connecting part between the plug 61 and the socket 71.

Figure 2:
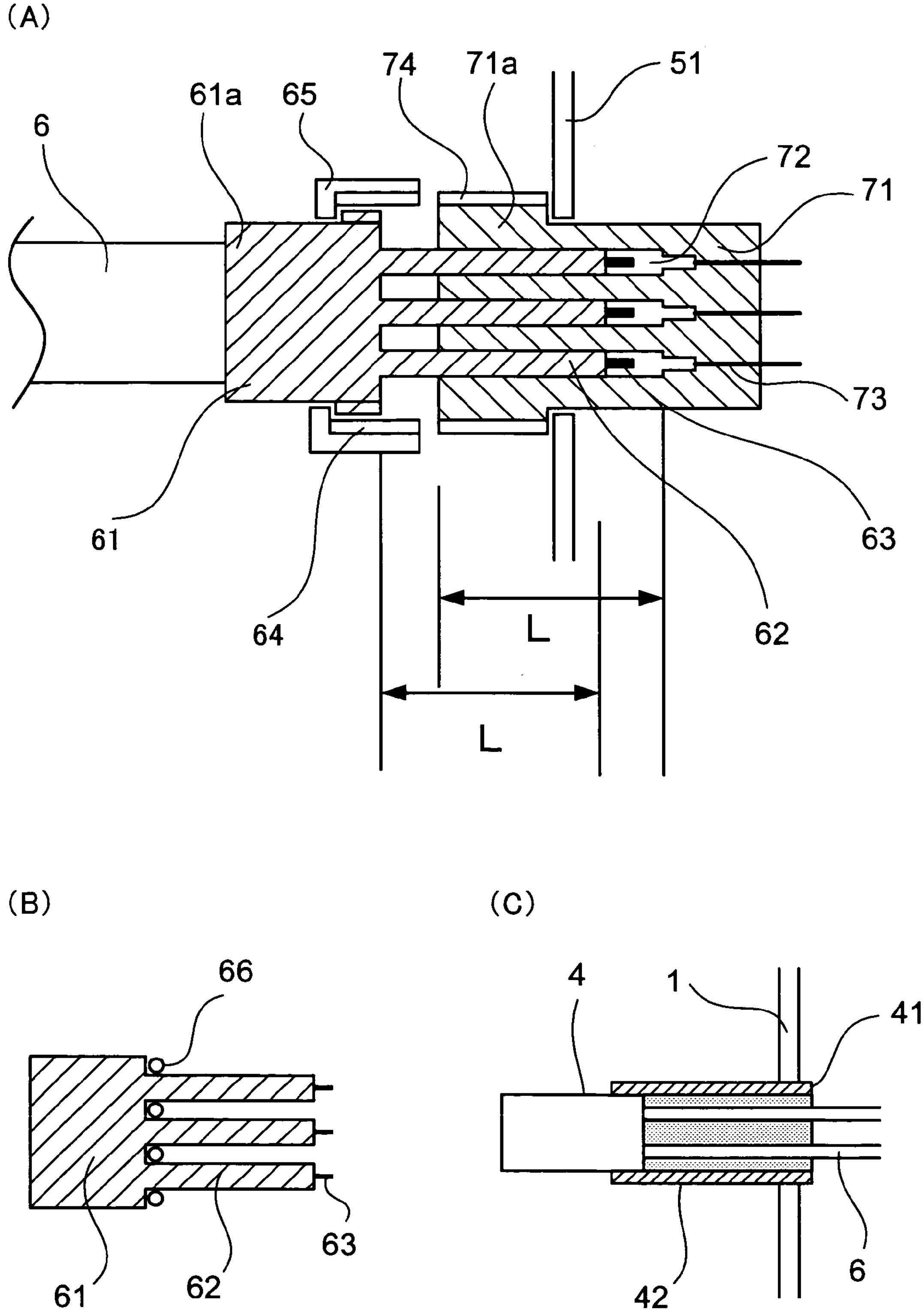
FIG. 2(A) is a sectional view which shows the construction of the connecting part between the high-voltage cable and the control device.
FIG. 2(B) is a diagram showing a state in which packing has been installed in the base end portion of the electrode supporting part.
FIG. 2(C) is a sectional view which shows the construction of the connecting part between the ionization source and the high-voltage cable.

(1-1-4) Construction of Connecting Part Between Ionization Source and High-Voltage Cable As is shown in FIG. 2(*c*), the connecting part (part B in FIG. 1) between the ionization source 4 and the high-voltage cable 6 is constructed by causing a pipe 41 made of a resin which has electrical insulating properties such as a polyvinyl chloride, polypropylene, acrylic or the like through the side surface of the chamber 1, and filling the interior of this pipe with an insulating resin 42 such as an epoxy resin or the like.

(1-1-5) Construction of Ionization Part

As is shown in FIG. 1, a slender tube (not shown in the figures) is connected to the side end portion (right side end portion in the figure) of the chamber 1 via a tube fitting 2, and the device is thus adapted so that the air inside the chamber that is the object of de-charging, or a non-reactive gas such as high-purity $N_2$ gas or the like (hereafter referred to as the "ion carrier gas") can be supplied to the interior of the chamber 1 via this tube. Here, furthermore, the term "high-purity $N_2$ gas" refers to $N_2$ gas which contains enough oxygen or water vapor to form negative ions, and which has an oxygen concentration (approximately 5% or less) that does not generate ozone.

Furthermore, an ionization source 4 is disposed near the installation position of the tube fitting 2 inside the chamber 1. Moreover, an ion generating device is formed by this ionization source 4 and the abovementioned control device 5.

Furthermore, the abovementioned ionization source 4 comprises the generating part of a soft X-ray generating device, the generating part of a low-energy electron beam generating device, the generating part of an ultraviolet radiation generating device or the like, and is adapted so that this ionization source ionizes the ion carrier gas that flows through the interior of the chamber 1.

(1-1-6) Construction of Shielding Part

In the present embodiment, as is shown in FIG. 1, the shielding part of the chamber 1 is formed by two punched plates 10*a* and 10*b* in which numerous fine holes 11 with a diameter of approximately 3 $\phi$ are formed. These two punched plates 10*a* and 10*b* are separated from each other by a distance of approximately 3 mm, and are disposed in shifted positions so that the fine holes 11 do not overlap.

(1-1-7) Construction of Blowing Part

The tip end portion of the chamber 1 is opened; this part is disposed in the vicinity of the charged body that is the object of de-charging, and is adapted so that the positive and negative ions generated in the abovementioned ion generating device are fed toward this charged body.

(1-1-8) Ionization Source

Next, the ionization source 4 will be described.

Soft X-rays are extremely weak X-rays with an energy of approximately 3 to 9.5 keV. Furthermore, a low-energy electron beam is an electron beam (soft electron beam) which is extracted at a low operating voltage of several tens of kilovolts by means of (for example) a super-compact electron beam irradiation tube manufactured by Ushio Denki K.K. or the like. This electron beam has a travel distance of only about 5 cm in air, and ionizes air or gases in this region.

Furthermore, in the case of a low-energy electron beam, since soft X-rays are also generated at the same time that ozone is generated in gases containing oxygen, shielding is necessary. Accordingly, in cases where a low-energy electron beam is used as an ionization source, it is desirable to use a non-reactive gas whose oxygen content is small enough that ozone is not generated, such as high-purity $N_2$ gas or the like, as the ion carrier gas. Furthermore, the ultraviolet radiation generated by an ultraviolet radiation generating device is short-wavelength radiation with a wavelength of 400 nm or less, and an output power of approximately 30 W.

In cases where the ionization source 4 is a soft X-ray generating part, either air or a non-reactive gas may be used as the ion carrier gas that is supplied to the chamber 1; however, in cases where the ionization source 4 is a low-energy electron beam generating part or ultraviolet radiation generating part, it is desirable to a non-reactive gas whose oxygen content is small enough that ozone is not generated, such as high-purity $N_2$ gas or the like, as the ion carrier gas.

(1-2) Effects and Merits

Next the effects and merits of the ionized gas current emission type dust-free ionizer of the present embodiment, which has the construction described above, will be described.

Since the ionized gas current emission type dust-free ionizer of the present embodiment uses the generating part of a soft X-ray generating device, the generating part of a low-energy electron beam generating device, the generating part of an ultraviolet radiation generating device or the like as an ionization source without using a corona discharge that might be a cause of ignition as this ionization source, the ignition of combustible substances such as organic solvents or the like can be prevented.

Furthermore, in the ionized gas current emission type dust-free ionizer of the present embodiment, a cooling device consisting of a Peltier element (thermoelectric cooling element) or the like is disposed inside the control device 5 that controls the quantity of ions generated by the abovementioned ionization source, so that heat radiating from the control board and heat sources disposed inside the control device, thus making it possible to control the interior of the device to a constant temperature; accordingly, the control device can be formed with an air-tight structure. As a result, the ignition of combustible substances such as organic solvents or the like by the control board and heat sources disposed inside the device can be prevented.

Furthermore, since the connecting part between the high-voltage cable 6 and the control device 5 has an explosion-proof structure of the type shown in FIG. 2, the attachment or detachment of the electrodes can be performed in an air-tight space formed by the electrode supporting parts 62 of the plug 61 and the insertion holes 72 of the socket 71; accordingly, the ignition of combustible substances such as organic solvents or the like caused by discharges during the attachment or detachment of the plug can be prevented. Furthermore, since the connecting part between the ionization source 4 and the high-voltage cable 6 also has an explosion-proof structure of the type shown in FIG. 1, the ignition of combustible substances such as organic solvents or the like in this connecting part can also be prevented.

Furthermore, in the ionized gas current emission type dust-free ionizer of the present embodiment, the ion carrier gas that is supplied to the chamber 1 via a tube (not shown in the figures) and the tube fitting 2 is converted into positive and negative ions by irradiation with soft X-rays, a low-energy electron beam, ultraviolet radiation or the like by the ionization source 4 contained in the chamber 1. Furthermore, these positive and negative ions pass through the shielding part installed on the downstream side of the ionization part, and are supplied to the charged body that constitutes the object of de-charging from the tip end portion of the chamber 1, so that the positive and negative charges of opposite polarity on the charged body can be respectively neutralized.

Thus, in the ionized gas current emission type dust-free ionizer of the present embodiment, in cases where the ionization source 4 is a soft X-ray generating part, there is no generation of ozone, regardless of whether air or a non-reactive gas is used as the ion carrier gas. Furthermore, there is no generation of dust such as the scattering of electrode materials or deposition and re-scattering of impurities in the air, and there is likewise no generation of electromagnetic noise.

Furthermore, in cases where the ionization source 4 is a low-energy electron beam or ultraviolet radiation generating part, since a non-reactive gas whose oxygen content is small enough that there is no generation of ozone, such as high-purity $N_2$ gas or the like, is used as the ion carrier gas, there is no generation of ozone, no generation of dust and no generation of electromagnetic noise during ionization.

Furthermore, soft X-rays or a low-energy electron beam can be sufficiently blocked by a thin polyvinyl chloride plate or the like, so that there is almost no reflection; accordingly, shielding can be accomplished using a simple structure of the type shown in FIG. 1. Moreover, since the distance from the ionization source 4 to the chamber outlet port is short, the following advantage is also obtained: namely, there is almost no decrease in ions due to the re-coupling of positive and negative ions.

Furthermore, as a result of the installation of the abovementioned shielding part, the disturbance of the gas current from the chamber blowing port can be reduced; accordingly, the following merit is also obtained: namely, the decrease in the quantity of ions caused by disturbance of the gas current can be ameliorated.

Furthermore, since the ionization source 4 and the control device 5 constituting the power supply part and control part of this ionization source 4 are installed separately with a high-voltage cable interposed, and since only the ionization source 4 is disposed inside the chamber 1, the internal diameter of the chamber 1 can be reduced; accordingly, the following merits can be obtained: namely, ions can be generated in an extremely narrow space, and de-charging can be performed even in the case of a narrow space such as (for example) the gaps between glass substrates accommodated inside a cassette.

Thus, the ionized gas current emission type dust-free ionizer of the present embodiment makes it possible to obtain an ionizer which allows countermeasures against static electricity to be taken in a narrow space without generating ozone, electromagnetic noise or dust, and which can be used in explosion-proof facilities and equipment.

(2) SECOND EMBODIMENT

The present embodiment is a modification in which the construction of the shielding part of the abovementioned first embodiment is altered.

Figure 3:
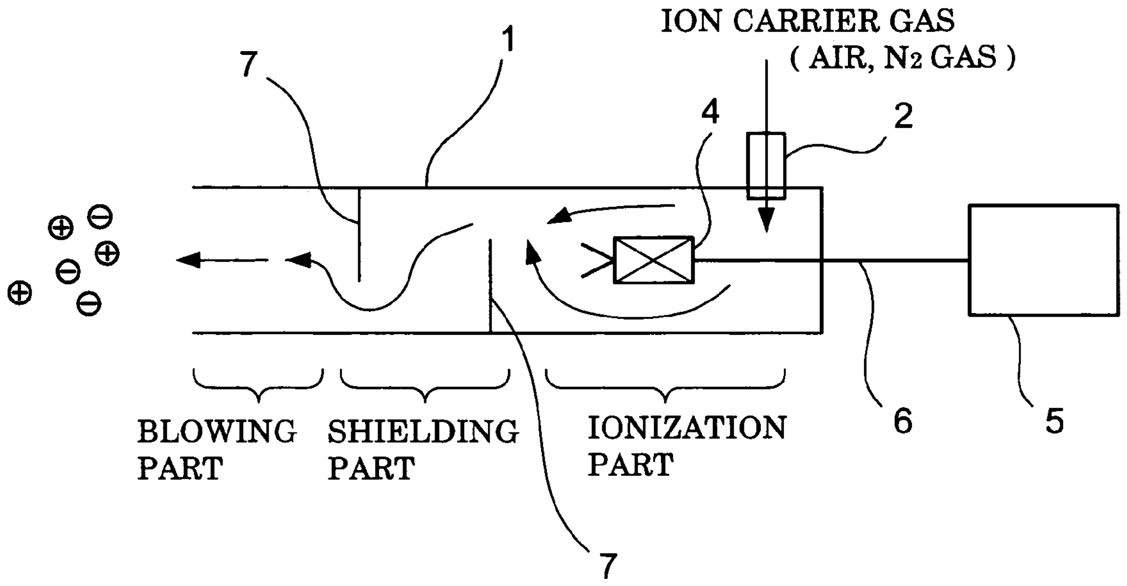
FIG. 3 is a model diagram which shows the construction of a second embodiment of the ionized gas current emission type dust-free ionizer of the present invention.

In the present embodiment, as is shown in FIG. 3, the shielding part of the chamber 1 is constructed from two semi-circular partition walls 7, 7; these partition walls 7, 7 are alternately formed on the upper part and lower part of the chamber 1 so that a fixed gap is left. Specifically, in cases where the ionization source 4 is a soft X-ray generating part or low-energy electron beam generating part, the system is adapted so that the linearly advancing soft X-rays or electron beam electrons strike the partition walls 7, 7, thus providing a construction in which shielding is provided so that these soft X-rays or electrons do not leak to the outside. Furthermore, in cases where the ionization source 4 is an ultraviolet radiation generating part, this shielding part is unnecessary. The remaining construction is the same as in the abovementioned first embodiment; accordingly, a description is omitted.

The ionized gas current emission type dust-free ionizer of the present embodiment, which has the construction described above, has the same effects and merits as the abovementioned first embodiment; this ionizer can be used in explosion-proof facilities and equipment, and can form the area on the downstream side of the ionization part of the chamber 1 into a shielding structure by means of a simple construction.

(3) THIRD EMBODIMENT

The present embodiment is a modification in which the construction of the blowing part of the abovementioned first embodiment is altered. Furthermore, it goes without saying that the blowing part of the present embodiment can also be applied to the abovementioned second embodiment.

Figure 4:
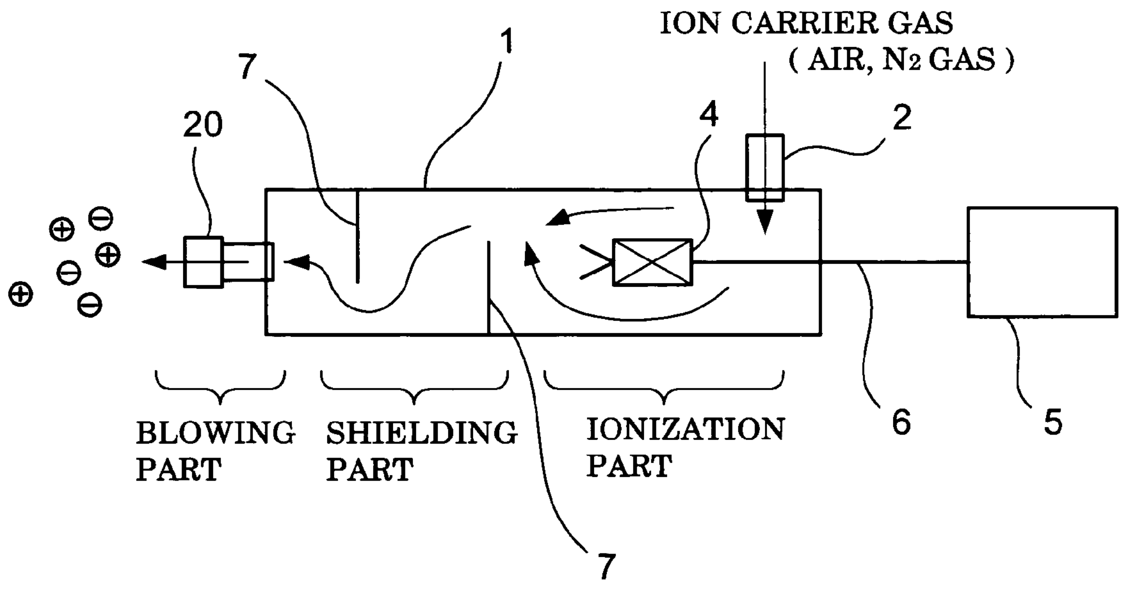
FIG. 4 is a model diagram which shows the construction of a third embodiment of the ionized gas current emission type dust-free ionizer of the present invention.

In the present embodiment, as is shown in FIG. 4, a nozzle 20 which is used to cause jetting of the ionized gas current is disposed on the downstream side of the shielding part of the chamber 1. For example, a nozzle 216, flat nozzle 920, air curtain 302–306, air knife 392–396 or the like manufactured by SILVENT Co. can be used as the abovementioned nozzle 20.

In the ionized gas current emission type dust-free ionizer of the present embodiment, which has the construction described above, the same effects and merits as those of the abovementioned first embodiment or second embodiment can be obtained; moreover, since a nozzle 20 which has a desired shape and size is attached to the blowing part, the ionized gas current can be blown onto the charged body at a high velocity, so that dirt or the like adhering to the charged body can be removed with a high efficiency while the charged body is de-charged. Furthermore, by selecting various types of nozzles 20, it is possible to broaden the ionized gas current at a wide angle in a conical shape, or to spread the ionized gas current into the form of an air curtain; accordingly, the ionized gas current can be controlled in accordance with the object of de-charging. Furthermore, by using a nozzle that allows adjustment of the degree of opening, it is easily possible to alter the jet velocity of the ionized gas current.

(4) FOURTH EMBODIMENT

The present embodiment is a modification in which the construction of the blowing part of the abovementioned third embodiment is further altered.

Figure 5:
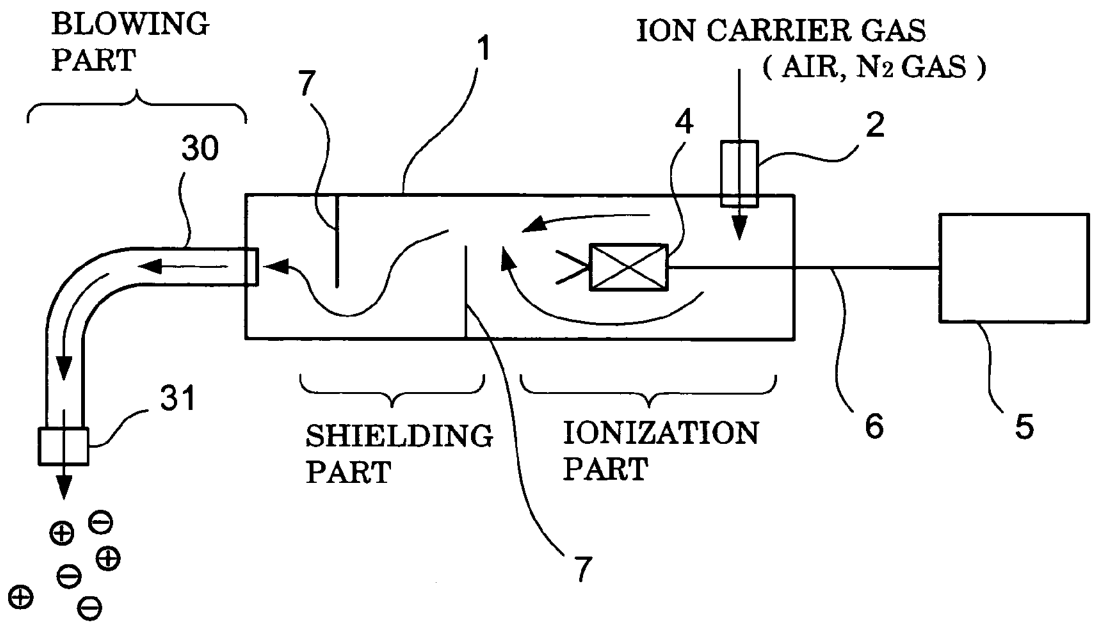
FIG. 5 is a model diagram which shows the construction of a fourth embodiment of the ionized gas current emission type dust-free ionizer of the present invention.

In the present embodiment, as is shown in FIG. 5, a flexible hose 30 is attached to the blowing part of the chamber 1, and a nozzle 31 is attached to the tip end of this flexible hose 30. Furthermore, as in the abovementioned third embodiment, a nozzle 216, flat nozzle 920, air curtain 302–306, air knife 392–396 or the like manufactured by SILVENT Co. can be used as the abovementioned nozzle 31. Furthermore, this flexible hose 30 differs from a vinyl tube or the like in that this hose has a structure can maintain a set shape.

In the ionized gas current emission type dust-free ionizer of the present embodiment, which has the construction described above, since a flexible hose 30 is attached to the blowing part and a nozzle 31 is further attached to the tip end of this flexible hose 30, not only can the same effects and merits as those of the abovementioned first through third embodiments be obtained, but it is also possible blow the ionized gas current onto the charged body at a high velocity, so that dirt or the like adhering to the charged body can be removed with a high efficiency while the charged body is de-charged. Furthermore, by selecting various types of nozzles 31, it is possible to broaden the ionized gas current at a wide angle in a conical shape, or to spread the ionized gas current into the form of an air curtain; accordingly, the ionized gas current can be controlled in accordance with the object of de-charging. Furthermore, by using a nozzle that allows adjustment of the degree of opening, it is easily possible to alter the jet velocity of the ionized gas current.

(5) FIFTH EMBODIMENT

The present embodiment is an embodiment in which the shielding part and blowing part are constructed as an integral unit.

Figure 6:
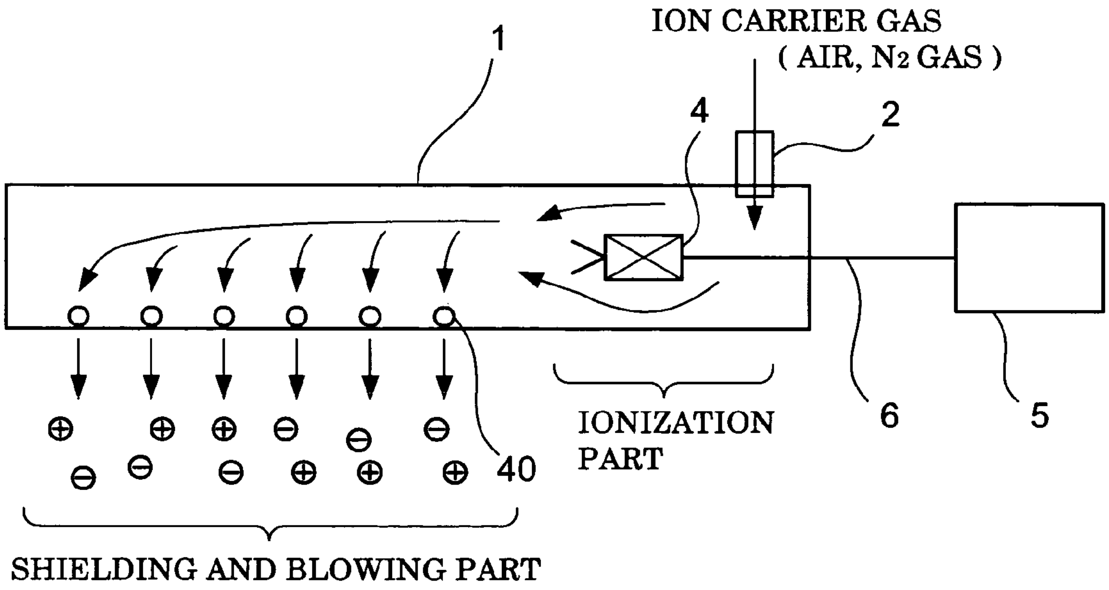
FIG. 6 is a model diagram which shows the construction of a fifth embodiment of the ionized gas current emission type dust-free ionizer of the present invention.

In the present embodiment, as is shown in FIG. 6, one or a plurality of openings (holes with a diameter of approximately 1 ϕ) 40 which are of a size that can block X-rays or the like are formed (in accordance with the object of de-charging) in a portion of the chamber (e. g., side surface) on the downstream side of the ionization source 4. Furthermore, in the present embodiment, these openings 40 function as a shielding part and a blowing part.

In the ionized gas current emission type dust-free ionizer of the present embodiment, which has the construction described above, since a plurality of openings which are of a size that can block X-rays are formed in a portion of the chamber on the downstream side of the ionization source 4, the jetting of an ionized gas current toward the object of de-charging can be accomplished simultaneously with shielding. Furthermore, as will be described below, the present embodiment is especially effective in cases where de-charging is performed by blowing an ionized gas current into the deep portions of narrow spaces such as the gaps between glass substrates in a cassette or the like.

(6) SIXTH EMBODIMENT

Figure 7:
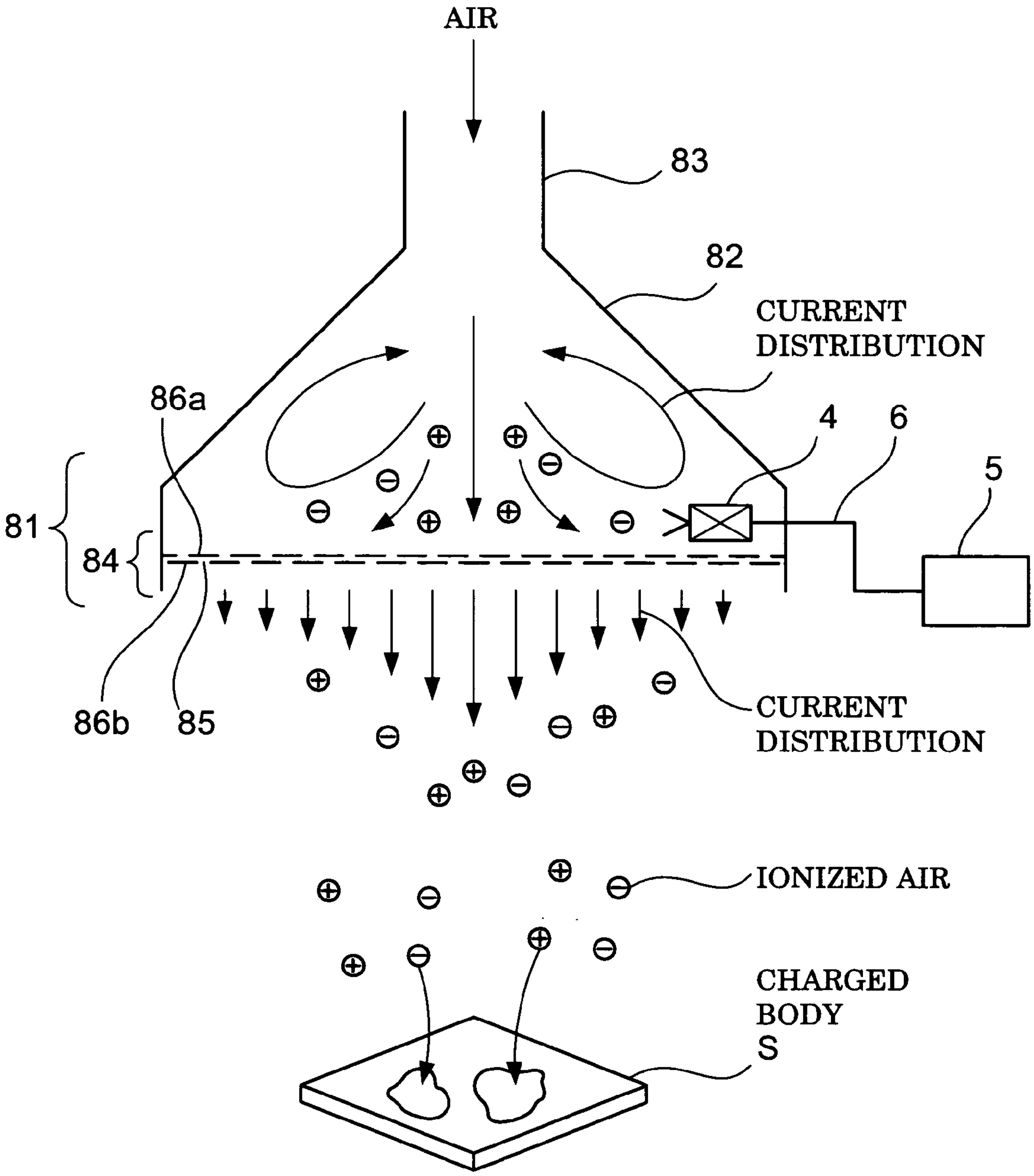
FIG. 7 is a model diagram which shows the construction of a sixth embodiment of the ionized gas current emission type dust-free ionizer of the present invention.

The ionized gas current emission type dust-free ionizer of the present embodiment has characterizing features in the construction of the blowing port. Specifically, as is shown in FIG. 7, the blowing port 81 in the present embodiment is formed in a cylindrical or prismatic shape, and a chamber 82 and duct 83 are connected to the upstream side of this blowing port 81. Furthermore, the duct 83 comprises piping which is used to supply air or a non-reactive gas such as high-purity $N_2$ gas or the like (hereafter referred to as the "ion carrier gas") to the object of de-charging in an explosion-proof facility via the abovementioned chamber 82 and blowing port 81. Moreover, the chamber 82 is formed (for example) in the shape of a cone or square pyramid so that the cross-sectional area on the downstream side is larger than that on the upstream side, and the end portion on the upstream side is connected to the abovementioned duct 83, while the end portion on the downstream side is connected to the abovementioned blowing port 81. Furthermore, it goes without saying that the chamber 82 and blowing port 81 can also be constructed as an integral unit.

Furthermore, a shielding part 84 is disposed in the vicinity of the tip end portion of the abovementioned blowing port 81. As is shown (for example) in FIG. 7, this shielding part 84 is constructed from two punched plates **86*a* and 86*b* with a thickness of 1 mm in which numerous fine holes 85 with a diameter of approximately 5 mm ϕ and an opening pitch of approximately 12 mm are formed. These two punched plates 86*a* and 86*b* are separated from each other by a distance of approximately 3 mm, and are disposed in positions that are shifted so that the abovementioned fine holes 85 do not overlap. Furthermore, the tip end portion of the blowing port 81** is open, and is disposed in the vicinity of the charged body S; the system is thus adapted so that positive and negative ions generated in the ion generating device are fed toward this charged body S.

Furthermore, an ion generating device is disposed in the side portion of the abovementioned blowing port 81. This ion generating device is constructed from an ionization source 4 which is disposed in the side portion of the blowing port 81, and a control device 5 which controls the quantity of ions generated by this ionization source 4. Furthermore, this control device 5 is disposed on the outside of the blowing port 81, and consists of a power supply part and control part which are used to generate soft X-rays or ultraviolet radiation from the ionization source; the control device 5 is connected to the ionization source 4 by a high-voltage cable 6.

Furthermore, the construction of this control device 5, the construction of the connecting part between the high-voltage cable 6 and the control device 5, and the construction of the connecting part between the ionization source 4 and the high-voltage cable 6, are the same as in the abovementioned first embodiment; accordingly, a description is omitted.

In the ionized gas current emission type dust-free ionizer of the present embodiment, which has the construction described above, this ionizer can be used in explosion-proof facilities and equipment; furthermore, since the ionization source 4 is contained internally in the vicinity of the outlet part of the blowing port 81, the ion carrier gas can be ionized in the vicinity of the blowing port 81, so that ionized air or the like can be supplied to the desired object of de-charging. Furthermore, since the ionization source 4 is contained internally in the side portion of the blowing port 81, and irradiation with radiation such as soft X-rays or the like is performed horizontally with the blowing port, a broad range can be covered by a single ionization source. Furthermore, since the ionization source 4 is contained internally in the vicinity of the outlet part of the blowing port 81, the distance from the ionization source 4 to the outlet of the blowing port is short, so that the following merit is also obtained: namely, there is little decrease in the ions due to the re-coupling of positive and negative ions.

(7) SEVENTH EMBODIMENT

Figure 8:
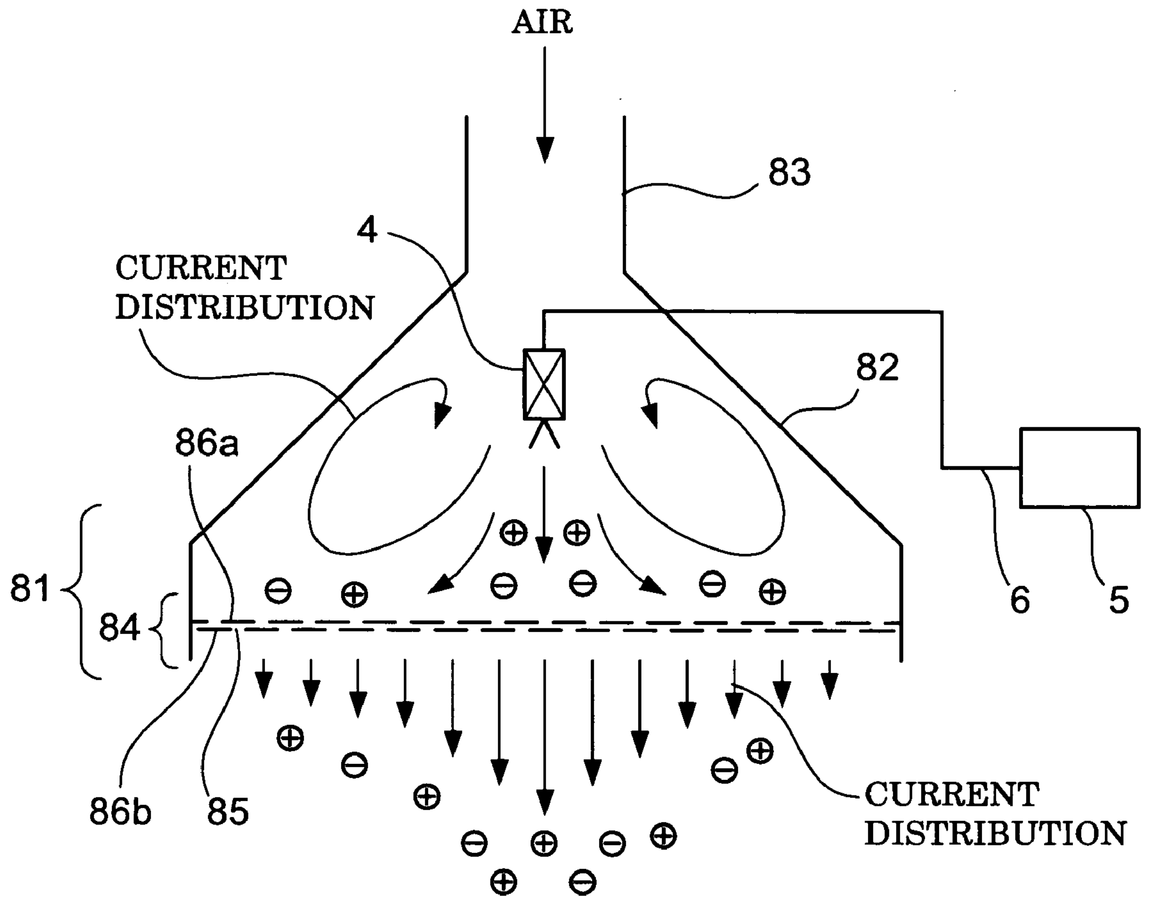
FIG. 8 is a model diagram which shows the construction of a seventh embodiment of the ionized gas current emission type dust-free ionizer of the present invention.

This embodiment is a modification in which the installation position of the ionization source of the abovementioned sixth embodiment is altered. Specifically, in the present embodiment, as is shown in FIG. 8, the ionization source 4 is disposed in the central portion of a chamber 82 which is formed in the shape of a cone or square pyramid. The remaining construction is the same as in the abovementioned sixth embodiment; accordingly, a description is omitted. Furthermore, the ionization source that can be disposed as shown in FIG. 8 is a soft X-ray or ultraviolet radiation generating part.

In the ionized gas current emission type dust-free ionizer of the present embodiment, which has the construction described above, not only can the same effects and merits as in the abovementioned sixth embodiment be obtained, but it also possible to perform ionization over a broad range with a small ionization source in the case of an ionization source that can emit soft X-rays or the like over a broad angle. Accordingly, since the ionization efficiency is good, and the quantity of ions generated is increased, the de-charging performance is improved. Furthermore, the angle of incidence of the radiation on the shielding plates is greater than in cases where irradiation is performed horizontally in the vicinity of the shielding plates; accordingly, shielding is facilitated, and shielding plate with vertical holes or the like are unnecessary.

(8) EIGHTH EMBODIMENT

Figure 9:
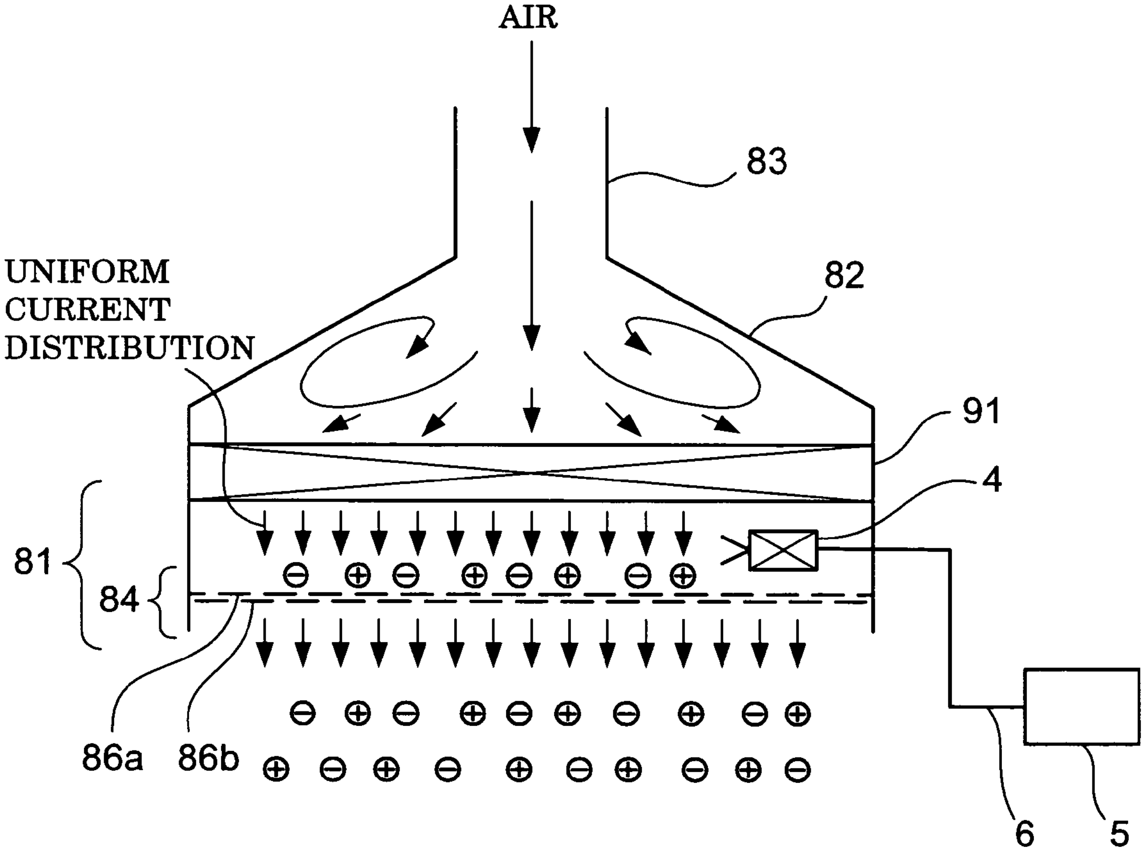
FIG. 9 is a model diagram which shows the construction of an eighth embodiment of the ionized gas current emission type dust-free ionizer of the present invention.

This embodiment is a modification of the abovementioned sixth embodiment, and indicates a case in which an HEPA filter or ULPA filter is disposed on the upstream side of the blowing port. Specifically, in the present embodiment, as is shown in FIG. 9, a laminar flow forming filter 91 such as a HEPA filter, ULPA filter or the like is disposed on the upstream side of the blowing port 81, and the system is adapted so that the ion carrier gas that is fed in via the duct 83 and chamber 82 can be formed into a gas current that has a uniform flow velocity distribution over the entire surface of the blowing port 81. Furthermore, in the present embodiment, the ionization source 4 is disposed in the vicinity of the side wall portion between the abovementioned laminar flow forming filter 91 and the shielding part 84. The remaining construction is the same as in the abovementioned sixth embodiment; accordingly, a description is omitted.

In the ionized gas current emission type dust-free ionizer of the present embodiment, which has the abovementioned construction, not only can the same effects and merits as those of the abovementioned sixth embodiment be obtained, but it is also possible to form the ion carrier gas that is fed in from the chamber 82 into a laminar flow, since a laminar flow forming filter 91 is disposed on the upstream side of the blowing port 81. As a result, in cases where a turbulent flow (jet) is supplied to the blowing port, the problem of a decrease in the quantity of ions and a drop in the de-charging efficiency due to the promotion of the re-coupling of positive and negative ions by the mixing effect can be prevented; accordingly, more efficient ionization can be accomplished, so that a superior de-charging performance can be obtained.

(9) NINTH EMBODIMENT

Figure 10:
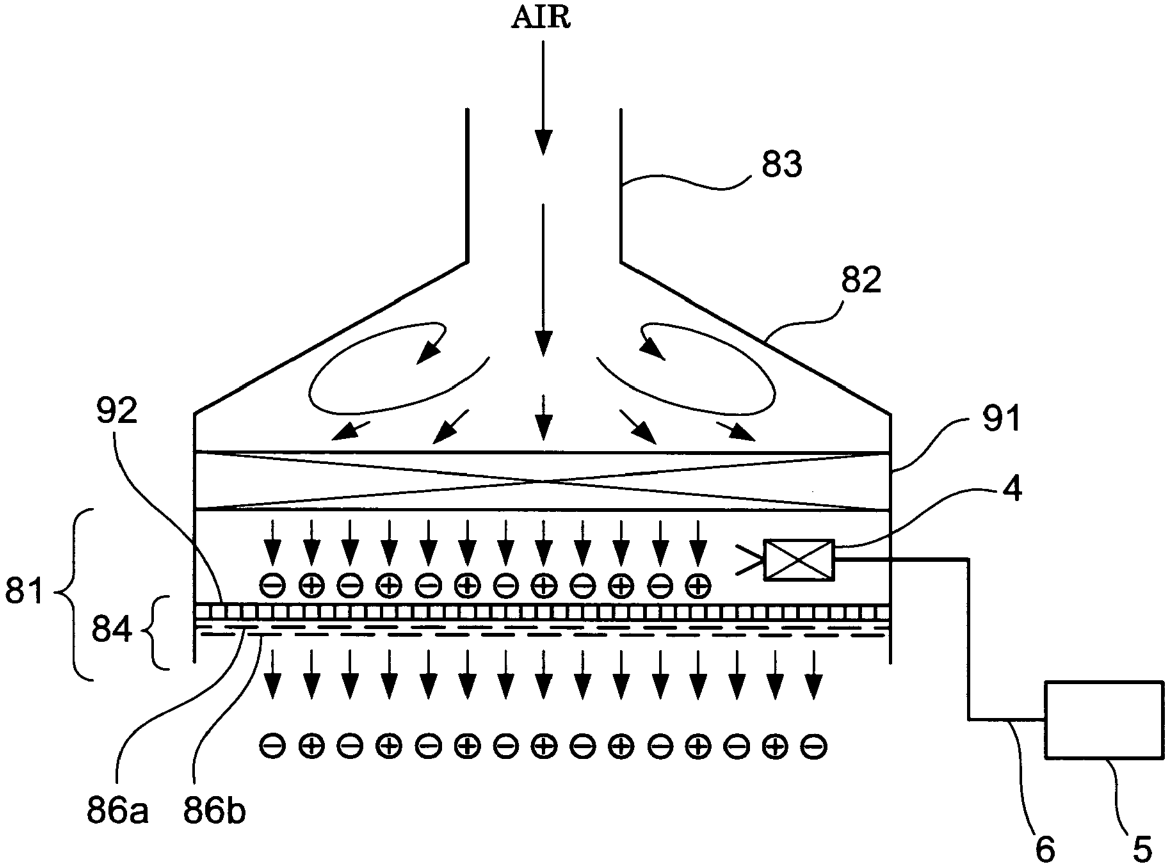
FIG. 10 is a model diagram which shows the construction of a ninth embodiment of the ionized gas current emission type dust-free ionizer of the present invention.
Figure 11:
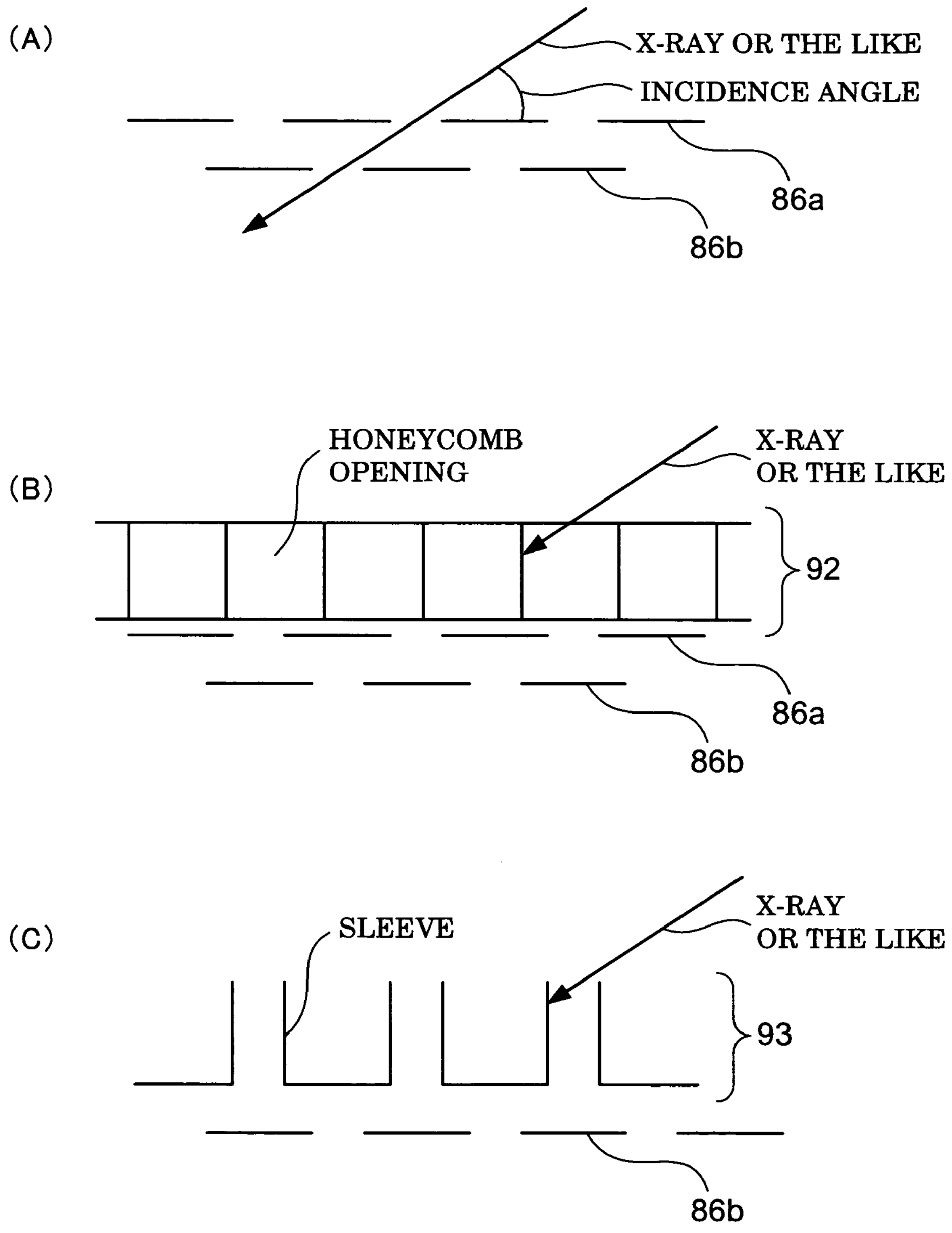
FIG. 11 shows diagrams which illustrate the construction of the shielding part of the blowing port in the ninth embodiment of the present invention, with FIG. 11(A) showing a case in which the shielding part is constructed from two punched plates, FIG. 11(B) showing a case in which an aluminum honeycomb is disposed in the shielding part, and FIG. 11(C) showing a case in which a sleeve-equipped punched plate is disposed in the shielding part.

The ionized gas current emission type dust-free ionizer of the present embodiment is a modification of the abovementioned sixth embodiment. In this ionizer, as is shown in FIGS. 10 and 11, a laminar flow forming filter 91 such as a HEPA filter, ULPA filter or the like is disposed on the upstream side of the blowing port 81, and an aluminum honeycomb 92 which has vertical holes is disposed on the upstream side of the two punched plates 86*a* and 86*b* disposed in the shielding part 84 of the blowing port 81. Furthermore, it would also be possible to install a sleeve-equipped punched plate 93 such as that shown in FIG. 11 (C) instead of installing an aluminum honeycomb 92 with vertical holes. The remaining construction is that same as that of the abovementioned sixth embodiment; accordingly, a description is omitted.

In the ionized gas current emission type dust-free ionizer of the present embodiment, which has the abovementioned construction, the ionizer can be used in explosion-proof facilities and equipment; furthermore, since a laminar flow forming filter 91 is disposed on the upstream said of the blowing port 81, the ion carrier gas that is fed in from the chamber 82 can be formed into a laminar flow. As a result, in cases where a turbulent flow (jet) is supplied to the blowing port, the problem of a decrease in the quantity of ions and a drop in the de-charging efficiency due to the promotion of the re-coupling of positive and negative ions by the mixing effect can be prevented; accordingly, more efficient ionization can be accomplished, so that a superior de-charging performance can be obtained.

Furthermore, as is shown in FIG. 11(A), in cases where two punched plates 86*a* and 86*b* are respectively disposed with a specified gap between the plates in positions that are shifted so that the fine holes formed in the respective plates do not overlap, it is difficult to completely block radiation such as soft X-rays or the like that is incident on the fine holes of the punched plates 86*a* and 86*b* at an inclination from above. However, in the blowing port of the present embodiment shown in FIG. 10, soft X-rays that are incident at an inclination from above are completely blocked by striking the side walls of the vertical hole parts in the aluminum honeycomb 92 as shown in FIG. 11(B), or are completely blocked by striking the side walls of the sleeve of the sleeve-equipped punched plate 93 as shown in FIG. 11(C).

(10) OTHER EMBODIMENTS

Furthermore, the present invention is not limited to the embodiments described above; various configurations such as those described below are possible. Specifically, the shapes or attachment positions and methods of respective concrete members may be appropriately altered. For example, the shape of the shielding part is not limited to the punched plates indicated in the respective embodiments described above; any shape that is capable of preventing the leakage of linearly advancing soft X-rays, low-energy electron beam electrons or the like to the outside, and that can carry the positive and negative ions that are generated, may be used.

Figure 12:
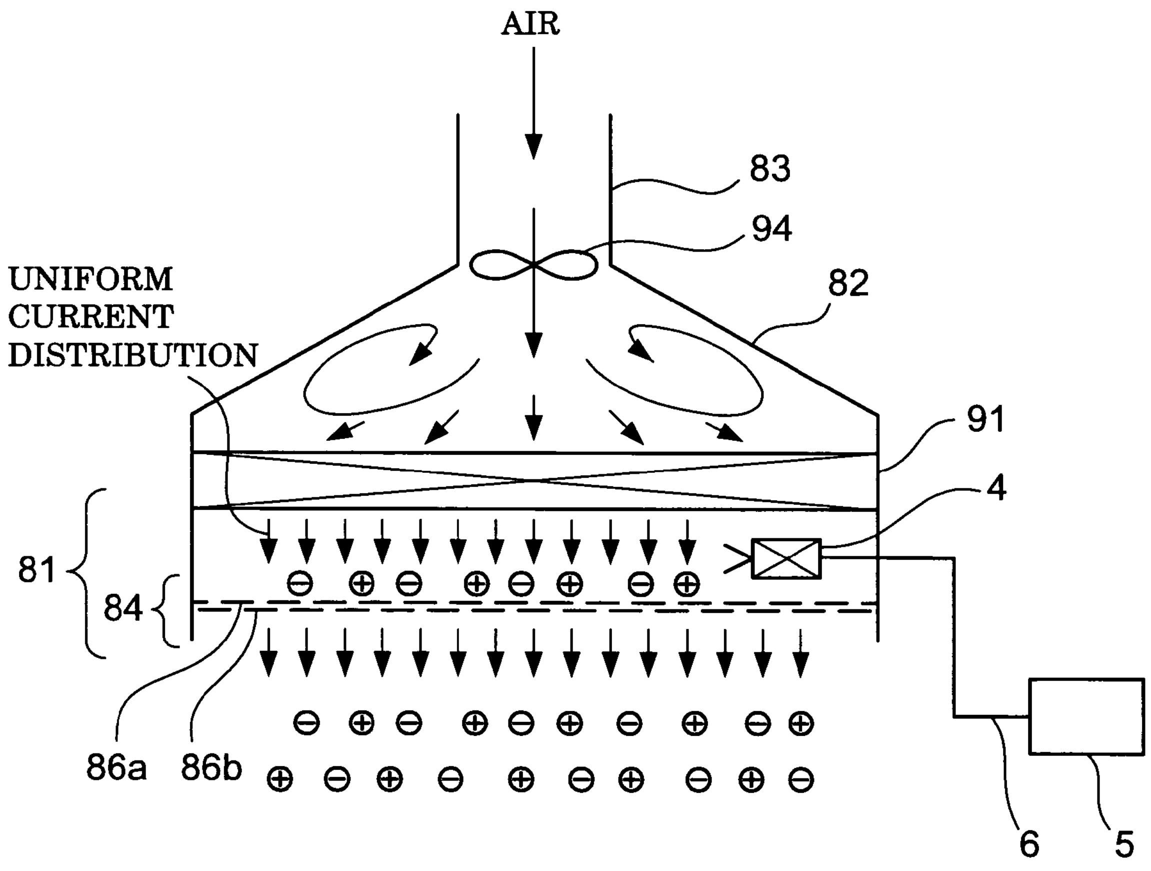
FIG. 12 is a model diagram which shows the construction of other embodiments of the ionized gas current emission type dust-free ionizer of the present invention.

Furthermore, the ionization source 4 is not limited to soft X-rays, a low-energy electron beam or ultraviolet radiation; other electromagnetic waves, beams or the like may be used as long as these sources do not generate ozone, dust or electromagnetic noise as a result of ionization. Moreover, as shown in FIG. 12, a construction in which an air supply fan 94 is incorporated may be applied.

INDUSTRIAL APPLICABILITY

As was described above, the present invention can provide an ionized gas current emission type dust-free ionizer which makes it possible to take countermeasures against static electricity in a narrow space without causing the generation of ozone, electromagnetic noise, dust or the like, and which can also be used in explosion-proof facilities and equipment.

The invention claimed is:

1. An ionized gas current emission type dust-free ionizer which comprises a chamber having an ionization part that ionizes a portion of an ion carrier gas that is supplied to the interior of this chamber, and a blowing part that feeds the ion carrier gas toward a charged body, and in which said ionization part is constructed from an ionization source that is contained in said chamber, and a control device which is disposed outside said chamber and which controls the quantity of ions generated by said ionization source via a high-voltage cable, this ionizer being characterized in that:

said ionization source is either the generating part of a soft X-ray generating device, the generating part of a low-energy electron beam generating device, or the generating part of an ultraviolet radiation generating device;

said chamber is formed in the shape of a cone or pyramid in which the cross-sectional area on the downstream side is greater than the cross-sectional area on the upstream side, a cylindrical or prismatic blowing part is disposed on the downstream side of said chamber, said ionization source is disposed in the vicinity of the inlet part of said blowing part;

a shielding part which is used to block the soft X-rays or low-energy electron beam generated by said ionization source is formed in the vicinity of the tip end portion of said blowing part; and a laminar flow forming filter made of HEPA filler or ULPA filter is disposed on the upstream side of said ionization source; and said shielding part is constructed from a plurality of shielding members each having an opening for allowing ions to pass through it when the ions are generated by said ionization source, wherein the plurality of shielding members are arranged in the flow direction of the ions such that the openings of each mutually-adjoining shielding member pair do not overlap.

2. The ionized gas current emission type dust-free ionizer according to claim 1, characterized in that said shielding part is constructed from a shielding plate having a honeycomb structure.

3. The ionized gas current emission type dust-free ionizer according to claim 1, characterized in that said shielding part is constructed from a shielding plate with sleeves.

4. The ionized gas current emission type dust-free ionizer according to claim 1, characterized in that said control device has an air-tight structure, and comprises cooling means capable of maintaining the interior of the device at a constant temperature.

5. The ionized gas current emission type dust-free ionizer according to claim 1, characterized in that:

the connecting part between said high-voltage cable and control device is constructed from a plug and socket that can be attached and detached, electrode supporting parts which have electrodes disposed on the tip end portions of these electrode supporting parts, insertion holes into which said electrode supporting parts are inserted are formed in said socket;

a stopper which is used to maintain the engagement with said socket is disposed on the outside of the base part of said plug, and an air-tightness maintaining member is disposed on the base end portions of said electrode supporting parts; and said plug and socket are adapted so that the attachment and detachment of said electrodes can be performed in a state in which an air-tight state between the electrode supporting parts of said plug and the insertion holes of the socket is maintained.

6. The ionized gas current emission type dust-free ionizer according to claim 1, characterized in that to connecting part between said ionization source and high-voltage cable is formed by a tubular resin that has insulating properties, and an insulating resin with which the interior of said tabular resin is filled.

7. The ionized gas current emission type dust-free ionizer according to claim 1, characterized in that said shielding part is constructed from a plurality of partition walls which are alternately disposed on the inside walls of said chamber with a specified gap.

8. The ionized gas current emission type dust-free ionizer according to claim 1, characterized in that said shielding part is constructed from at least two shielding plates in which a plurality of fine holes are formed, and said shielding plates are disposed so that said fine holes do not overlap.

9. The ionized gas current emission type dust-free ionizer according to claim 1, characterized in that said blowing part is constructed from a nozzle with a specified shape which is attached to the open end of said chamber.

10. The ionized gas current emission type dust-free ionizer according to claim 1, characterized in that said blowing part is constructed from a flexible hose attached to the open end of said chamber, and a nozzle with a specified shape which is attached to the tip end thereof.

11. An ionized gas current emission type dust-free ionizer which comprises a chamber having an ionization part that ionizes a portion of an ion carrier gas that is supplied to the interior of this chamber, and a blowing part that feeds the ion carrier gas toward a charged body, and in which said ionization part is constructed from an ionization source that is contained in said chamber, and a control device which is disposed outside said chamber and which controls the quantity of ions generated by said ionization source via a high-voltage cable, this ionizer being characterized in that:

said ionization source is either the generating part of a soft X-ray generating device, the generating part of a low-energy electron beam generating device, or the generating part of an ultraviolet radiation generating device;

said chamber is formed in the shape of a cone or pyramid in which the cross-sectional area on the downstream side is greater than the cross-sectional area on the upstream side, a cylindrical or prismatic blowing part is disposed on the downstream side of said chamber, said ionization source is disposed in the vicinity of the inlet part of said blowing part;

a shielding part which is used to block the soft X-ray or low-energy electron beam generated by said ionization source is formed in the vicinity of the tip end portion of said blowing part; and said shielding part is constructed from a plurality of shielding members each having an opening for allowing ions to pass through it when the ions are generated by said ionization source, wherein the plurality of shielding members are arranged in the flow direction of the ions such that the openings of each mutually-adjoining shielding member pair do not overlap.

12. The ionized gas current emission type dust-free ionizer according to claim 11, characterized in that said shielding part is constructed from a shielding plate having a honeycomb structure.

13. The ionized gas current emission type dust-free ionizer according to claim 11, characterized in that said shielding part is constructed from a shielding plate with sleeves.

14. The ionized gas current emission type dust-free ionizer according to claim 11, characterized in that said control device has an air-tight structure, and comprises cooling means capable of maintaining the interior of the device at a constant temperature.

15. The ionized gas current emission type dust-free ionizer according to claim 11, characterized in that:

the connecting part between said high-voltage cable and control device is constructed from a plug and socket that can be attached and detached, electrode supporting parts which have electrodes disposed on the tip end portions of these electrode supporting parts, insertion holes into which said electrode supporting parts are inserted are formed in said socket;

a stopper which is used to maintain the engagement with said socket is disposed on the outside of the base part of said plug, and an air-tightness maintaining member is disposed on the base end portions of said electrode supporting parts; and said plug and socket are adapted so that the attachment and detachment of said electrodes can be performed in a state in which air-tight state between the electrode supporting parts of said plug and the insertion holes of the socket is maintained.

16. The ionized gas current emission type dust-free ionizer according to claim 11, characterized in that the connecting part between said ionization source and high-voltage cable is formed by a tubular resin that has insulating properties, and an insulating resin with which the interior of said tubular resin is filled.

17. The ionized gas current emission type dust-free ionizer according to claim 11, characterized in that said shielding part is constructed from a plurality of partition walls which an alternately disposed on the inside walls of said chamber with a specified gap.

18. The ionized gas current emission type dust-free ionizer according to claim 11, characterized in that said shielding part is constructed from at least two shielding plates in which a plurality of fine holes are formed, and said shielding plates are disposed so that said fine holes do not overlap.

19. The ionized gas correct emission type dust-free ionizer according to claim 11, characterized in that said blowing part is constructed from a nozzle with a specified shape which is attached to the open end of said chamber.

20. The ionized gas current emission type dust-free ionizer according to claim 11, characterized in that said blowing part is constructed from a flexible hose attached to the open end of said chamber, and a nozzle with a specified shape which is attached to the tip end thereof.

21. An ionized gas current emission type dust-free ionizer according to claim 11, characterized in that a laminar flow forming filter made of HEPA filter or ULPA filter is disposed on the upstream side of said ionization source.

22. The ionized gas current emission type dust-free ionizer according to claim 21, characterized in that said shielding part is constructed from a shielding plate having a honeycomb structure.

23. The ionized gas current emission type dust-free ionizer according to claim 21, characterized in that said shielding part is constructed from a shielding plate with sleeves.

24. The ionized gas current emission type dust-free ionizer according to claim 21, characterized in that said control device has an air-tight structure, and comprises cooling means capable of maintaining the interior of the device at a constant temperature.

25. The ionized gas current emission type dust-free ionizer according to claim 21, characterized in that:

the connecting part between said high-voltage cable and control device is constructed from a plug and socket that can be attached and detached, electrode supporting parts which have electrodes disposed on the tip end portions of these electrode supporting parts, insertion holes into which said electrode supporting parts are inserted are formed in said socket;

a stopper which is used to maintain the engagement with said socket is disposed on the outside of the base part of said plug, and an air-tightness maintaining member is disposed on the base end portions of said electrode supporting parts; and said plug and socket are adapted so that the attachment and detachment of said electrodes can be performed in a state in which an air-tight state between the electrode supporting parts of said plug and the insertion holes of the socket is maintained.

26. The ionized gas current emission type dust-free ionizer according to claim 21, characterized in that the connecting part between said ionization source and high-voltage cable is formed by a tubular resin that has insulating properties, and an insulating resin with which the interior of said tubular resin is filled.

27. The ionized gas current emission type dust-free ionizer according to claim 21, characterized in that said shielding part is constructed from a plurality of partition walls which are alternately disposed on the inside walls of said chamber with a specified gap.

28. The ionized gas current emission type dust-free ionizer according to claim 21, characterized in that said shielding part is constructed from at least two shielding plates in which a plurality of fine holes are formed, and said shielding plates are disposed so that said fine holes do not overlap.

29. The ionized gas current emission type dust-free ionizer according to claim 21, characterized in that said blowing part is constructed from a nozzle with a specified shape which is attached to the open end of said chamber.

30. The ionized gas current emission type dust-free ionizer according to claim 21, characterized in that said blowing part is constructed from a flexible hose attached to the open end of said chamber, and a nozzle with a specified shape which is attached to the tip end thereof.

* * * * *